United States Patent
Gadkaree et al.

(10) Patent No.: US 7,456,057 B2
(45) Date of Patent: Nov. 25, 2008

(54) GERMANIUM ON GLASS AND GLASS-CERAMIC STRUCTURES

(75) Inventors: Kishor Purushottam Gadkaree, Big Flats, NY (US); Paul Stephen Danielson, Corning, NY (US); Matthew John Dejneka, Corning, NY (US); Josef Chauncey Lapp, Corning, NY (US); Linda Ruth Pinckney, Corning, NY (US)

(73) Assignee: Corning Incorporated, Corning, NY (US)

( * ) Notice: Subject to any disclaimer, the term of this patent is extended or adjusted under 35 U.S.C. 154(b) by 138 days.

(21) Appl. No.: 11/415,732

(22) Filed: May 1, 2006

(65) Prior Publication Data

US 2007/0166947 A1    Jul. 19, 2007

Related U.S. Application Data

(60) Provisional application No. 60/755,934, filed on Dec. 31, 2005.

(51) Int. Cl.
*H01L 21/338* (2006.01)

(52) U.S. Cl. ............................ 438/179; 438/178

(58) Field of Classification Search .............. 438/309, 438/400, 404, 584, 585, 758, 763, 933, 967, 438/478, 479
See application file for complete search history.

(56) References Cited

U.S. PATENT DOCUMENTS

| | | | |
|---|---|---|---|
| 5,250,818 A | 10/1993 | Srarswat | 257/66 |
| 6,204,608 B1 | 3/2001 | Song | 315/693 |
| 6,319,867 B1 | 11/2001 | Chacon et al. | 501/66 |
| 6,593,624 B2 | 7/2003 | Walker | 257/344 |
| 6,852,652 B1 | 2/2005 | Maa et al. | 438/933 |
| 2002/0014625 A1 | 2/2002 | Asami | 257/57 |
| 2002/0045312 A1 | 4/2002 | Zheng | 438/253 |
| 2002/0082158 A1* | 6/2002 | Chacon et al. | 501/66 |
| 2003/0013305 A1 | 1/2003 | Sugii | 438/689 |
| 2004/0229444 A1* | 11/2004 | Couillard et al. | 438/455 |
| 2005/0042842 A1 | 2/2005 | Lei | 438/459 |
| 2005/0051140 A1 | 3/2005 | Yamaguchi | 123/479 |
| 2005/0056899 A1 | 3/2005 | Rendon | 257/408 |
| 2005/0056911 A1 | 3/2005 | Bhattacharyya | 257/538 |
| 2005/0093100 A1 | 5/2005 | Chen | 257/616 |
| 2005/0142964 A1* | 6/2005 | Katz et al. | 442/42 |
| 2005/0287767 A1 | 12/2005 | Dantz | 438/459 |
| 2006/0019464 A1 | 1/2006 | Maa | 438/458 |
| 2007/0190338 A1* | 8/2007 | Aitken et al. | 428/432 |

FOREIGN PATENT DOCUMENTS

| | | |
|---|---|---|
| EP | 0557588 | 11/1992 |
| WO | WO2007/061563 | 5/2007 |

\* cited by examiner

*Primary Examiner*—Walter L. Lindsay, Jr.
*Assistant Examiner*—Kenisha V Ford
(74) *Attorney, Agent, or Firm*—Timothy M. Schaeberle

(57) ABSTRACT

A semiconductor-on-insulator structure including first and second layers which are attached to one another either directly or through one or more intermediate layers. The first layer includes a substantially single crystal germanium semiconductor material while the second layer comprises a glass or a glass-ceramic material having a linear coefficient thermal of expansion (25-300° C.) which is within the range of +/−20×10$^{-7}$/° C. of the linear coefficient thermal of expansion of the germanium first layer.

20 Claims, 6 Drawing Sheets

US 7,456,057 B2

GERMANIUM ON GLASS AND GLASS-CERAMIC STRUCTURES

CROSS-REFERENCE TO RELATED APPLICATIONS

This application claims the benefit of priority under 35 U.S.C. § 119(e) of U.S. Provisional Application Ser. No. 60/755,934 filed on Dec. 31, 2005.

BACKGROUND

The present invention relates to semiconductor-on-insulator (SOI) structures, such as semiconductor on glass or glass ceramic, and methods for making same. In particular, the present invention relates to germanium on glass or glass-ceramic structures (GeOG), and more particularly germanium on expansion-matched glass or glass-ceramic substrates.

To date, the semiconductor material most commonly used in semiconductor-on-insulator structures has been silicon. Such structures have been referred to in the literature as silicon-on-insulator structures and the abbreviation "SOI" has been applied to such structures. Silicon-on-insulator technology is becoming increasingly important for high performance photovoltaic applications (e.g., solar cells), thin film transistor applications, and displays, such as, active matrix displays. Known silicon-on-insulator wafers consist of a thin layer of substantially single crystal silicon (generally 0.1-0.3 microns in thickness but, in some cases, as thick as 5 microns) on an insulating material.

For ease of presentation, the following discussion will at times be in terms of silicon-on-insulator structures. The references to this particular type of semiconductor-on-insulator structure are made to facilitate the explanation of the invention and are not intended to, and should not be interpreted as, limiting the invention's scope in any way. The SOI abbreviation is used herein to refer to semiconductor-on-insulator structures in general, including, but not limited to, both silicon-on-insulator and germanium-on-insulator structures. Similarly, the SOG abbreviation is used to refer to semiconductor-on-glass structures in general, including, but not limited to, silicon-on-glass (SiOG) and germanium-on-glass structures (GeOG). The SOG nomenclature is also intended to include semiconductor-on-glass-ceramic structures, including, but not limited to, silicon-on-glass-ceramic structures. The abbreviation SOI encompasses SOG structures.

The various ways of obtaining SOI structures include epitaxial growth of Si on lattice matched substrates. An alternative process includes the bonding of a single crystal silicon wafer to another silicon wafer on which an oxide layer of $SiO_2$ has been grown, followed by polishing or etching of the top wafer down to, for example, a 0.1 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

The former two methods have not resulted in satisfactory structures in terms of cost and/or bond strength and durability. The latter method involving hydrogen ion implantation has received some attention and has been considered advantageous over the former methods because the implantation energies required are less than 50% of that of oxygen ion implants and the dosage required is two orders of magnitude lower.

Exfoliation by the hydrogen ion implantation method typically consists of the following steps. A thermal oxide layer is grown on a single crystal silicon wafer. Hydrogen ions are then implanted into this wafer to generate subsurface flaws. The implantation energy determines the depth at which the flaws are generated and the dosage determines flaw density. This wafer is then placed into contact with another silicon wafer (the support substrate) at room temperature to form a tentative bond. The wafers are then heat-treated to about 600 degrees C. to cause growth of the subsurface flaws for use in separating a thin layer of silicon from the Si wafer. The resulting assembly is then heated to a temperature above 1,000 degrees C. to fully bond the Si film with $SiO_2$ underlayer to the support substrate, i.e., the unimplanted Si wafer. This process thus forms an SOI structure with a thin film of silicon bonded to another silicon wafer with an oxide insulator layer in between.

Cost is an important consideration for commercial applications of SOI structures. To date, a major part of the cost of the above-described method and structure has been the cost of the silicon wafer which supports the oxide layer, topped by the Si thin film, i.e., a major part of the cost has been the support substrate. Although the use of quartz as a support substrate has been mentioned in various patents (see U.S. Pat. Nos. 6,140,209 6,211,041, 6,309,950, 6,323,108, 6,335,231, and 6,391,740), quartz is itself a relatively expensive material. In discussing support substrates, some of the above references have mentioned quartz glass, glass, and glass-ceramics. Other support substrate materials listed in these references include diamond, sapphire, silicon carbide, silicon nitride, ceramics, metals, and plastics.

U.S. Pat. No. 5,374,564 discloses a process to obtain a single crystal silicon film on a substrate using a thermal process. A semiconductor material wafer having a planar face is subject to the following steps: (i) implantation by bombardment of a face of the wafer by means of ions creating a layer of gaseous micro-bubbles defining a lower region constituting the mass of the substrate and an upper region constituting the thin film; (ii) contacting the planar face of the wafer with a stiffener constituted by at least one rigid material layer; and (iii) a third stage of heat treating the assembly of the wafer and the stiffener at a temperature above that at which the ion bombardment was carried out and sufficient to create a pressure effect in the micro-bubbles and a separation between the thin film and the mass of the substrate. Due to the high temperature steps, this process does not work with lower cost glass or glass-ceramic substrates.

U.S. Patent Application No.: 2004/0229444 discloses a process for producing a SOG structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) cooling the structure to a common temperature to facilitate separation of the glass substrate and a thin layer of silicon from the silicon wafer. The SOI formation technique disclosed in U.S. Patent Application No.: 2004/0229444 has been shown to result in a relatively thin semiconductor layer (e.g., about 1-5 um) bonded to a glass substrate.

While this semiconductor thickness is sufficient for some if not most applications, and is an improvement over such over bulk semiconductor materials which typically exhibit thicknesses of at least 200 microns thick, these silicon or silicon-based alloys/oxide glass or an oxide glass-ceramic based SOI structures may not provide a satisfactory layer semiconductor thickness for other applications; e.g., MOS transistors, optical detectors and other optoelectronic devices, and high performance solar cells/photovoltaic devices.

Recently, structures for achieving thinner semiconductor layer SOI structures have been described in US Pat. Apps. 2005/0093100 and 2005/0042842, and U.S. Pat. No. 6,759, 712; in particular methods of making devices based on germanium-on-insulator, also known as GOI, are disclosed. The semiconductor conducting films disclosed in the aforementioned GOI applications generally have thicknesses of less than 200 nm (0.2 microns). As disclosed therein, germanium is effective in thin film, high performance/high quantum efficiency applications/devices as a result of germanium's higher carrier (hole and electron) mobility and optical absorption when compared to those of silicon. In addition to having high electron and hole mobilities, germanium has other advantages such as lower contact resistance and lower dopant activation temperatures than those required by silicon, thus facilitating the formation of shallow junctions.

While the "insulator" described in references these studies is generally a buried insulator layer, typically an oxide or nitride, within a semiconducting material (Ge, Si, GaAs, SiC . . . ), glass is disclosed as a possible, non-semiconducting material, substrate. One problem associated with the use of glass as a substrate material when bonded to Ge is the potential thermal expansion mismatch between the Ge film and the substrate to which it is bonded; this phenomenon is particularly problematic in the case of Ge film on a silica glass. Significant expansion mismatches would lead to high film stresses and probable crazing or delamination.

Despite the above described benefits of thin-film GeOI devices, the above mismatch problem when utilizing glass as the insulator/substrate, is still prevalent and has not been addressed. As such, there is a need for GeOI, particularly GeOG devices which comprise a glass insulator/substrate that does not exhibit the aforementioned expansion mismatch problem; i.e., a GeOG device in which the substrate possesses thermal expansion characteristics that are compatible with those CTE characteristics of the Ge semiconducting film.

SUMMARY OF THE INVENTION

One embodiment of the present invention relates to a semiconductor-on-insulator structure including first and second layers which are attached to one another either directly or through one or more intermediate layers. The first layer includes a substantially single crystal germanium semiconductor material while the second layer comprises a glass or a glass-ceramic material having a linear coefficient thermal of expansion (25-300° C.) which is within the range of +/−20×$10^{-7}$/° C. of the linear coefficient thermal of expansion of the germanium first layer.

In a further embodiment, the second layer comprises a glass or a glass-ceramic material having a linear coefficient thermal of expansion (25-300° C.) which is within the range of +/−10×$10^{-7}$/° C. of the linear coefficient thermal of expansion of the germanium first layer.

Additional features and advantages of the invention will be set forth in the detailed description which follows, and in part will be readily apparent to those skilled in the art from the description or recognized by practicing the invention as described in the written description and claims hereof, as well as in the appended drawings.

It is to be understood that both the foregoing general description and the following detailed description are merely exemplary of the invention, and are intended to provide an overview or framework for understanding the nature and character of the invention as it is claimed.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PRESENT INVENTION

Figure 1:
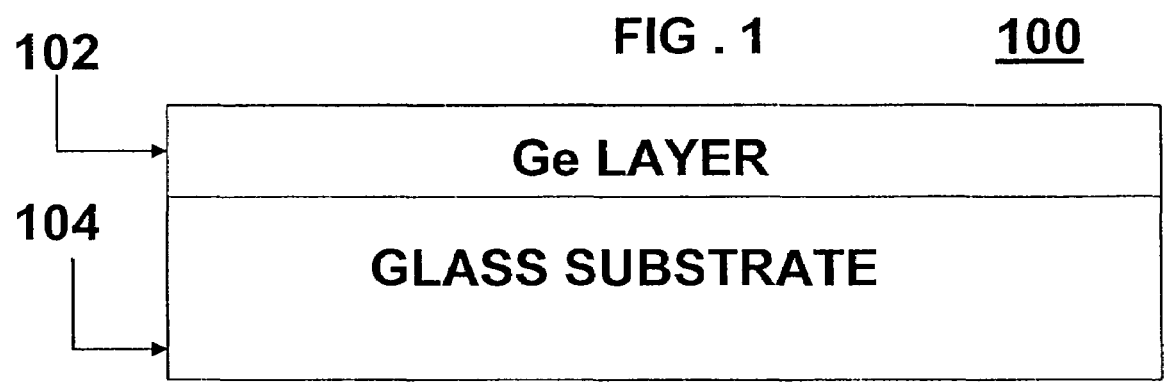
FIG. 1 is a block diagram illustrating the structure of a GeOG device in accordance with one or more embodiments of the present invention.

With reference to the drawings, wherein like numerals indicate like elements, there is shown in FIG. 1 an GeOG structure 100 in accordance with one or more embodiments of the present invention. The GeOG structure 100 preferably includes a first layer 102 which comprises a substantially single crystal semiconductor material comprising germanium and a second layer 104 which comprises a glass or a glass-ceramic having a linear coefficient thermal of expansion (25-300° C.) which is within the range of +/−20×$10^{-7}$/° C. of the linear coefficient thermal of expansion of the germanium first layer.

In another embodiment, the GeOG structure 100 preferably includes a first layer 102 which comprises a substantially single crystal semiconductor material comprising germanium and a second layer 104 which comprises a glass or a glass-ceramic having a linear coefficient thermal of expansion (25-300° C.) which is within the range of +/−10×$10^{-7}$/° C. of the linear coefficient thermal of expansion of the germanium first layer.

The GeOG structure 100 has suitable uses in connection with fabricating thin film transistors (TFTs), e.g., for display applications, including organic light-emitting diode (OLED) displays and liquid crystal displays (LCDs), and integrated circuits. This thin Ge film/glass GeOG structure is particularly suitable for use in and high performance solar cells/photovoltaic devices.

The semiconductor material of the layer 102 is preferably in the form of a substantially single-crystal germanium material. The word "substantially" is used in describing the layer 102 to take account of the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor. A substantially single-crystal germanium material comprises at least 90% Ge, and thus may include up to 10% include up other constituents and/or dopants, for example Si.

The first, Ge semiconductor, layer 102 can have virtually any suitable thickness, though typically less then about 1 μm in thickness, and is desirably between about 0.05 to 0.5 μm in thickness for electronic applications and desirably between 1 and 10 μm in thickness for photovoltaic applications. The germanium semiconductor material of the first layer typically exhibits a CTE (25-300° C.) of about $61 \times 10^{-7}$/° C.

The glass or glass-ceramic substrate 104 is preferably formed from an oxide glass or an oxide glass-ceramic. Although not required, the embodiments described herein preferably include an oxide glass or glass-ceramic exhibiting a strain point of less than about 1,000 degrees C. As is conventional in the glass making art, the strain point is the temperature at which the glass or glass-ceramic has a viscosity of $10^{14.6}$ poise ($10^{13.6}$ Pa·s). As between oxide glasses and oxide glass-ceramics, the glasses are presently preferred because they are typically simpler to manufacture, thus making them more widely available and less expensive.

The glass substrate preferably has a thickness in the range of about 0.1 mm to about 10 mm and most preferably in the range of about 0.5 mm to about 1 mm. For some GeOG, insulating layers having a thickness greater than or equal to about 1 micron are desirable, e.g., to avoid parasitic capacitive effects, which may arise when the GeOG structures are operated at high frequencies. In the past, such thicknesses have been difficult to achieve. In accordance with the present invention, a GeOG structure having an insulating layer thicker than about 1 micron is readily achieved by simply using a glass substrate 104 having a thickness that is greater than or equal to about 1 micron.

In general, the glass or glass-ceramic substrate 104 should be thick enough to support the Ge semiconductor layer 102 through the process steps of the invention, as well as subsequent processing performed on the GeOG structure 100. Although there is no theoretical upper limit on the thickness of the glass substrate 104, a thickness beyond that needed for the support function or that desired for the ultimate GeOG structure 100 is generally not preferred since the greater the thickness of the glass substrate 104, the more difficult it will be to accomplish at least some of the process steps in forming the GeOG structure 100.

The oxide glass or oxide glass-ceramic substrate 104 is preferably silica-based. Thus, the amount of $SiO_2$ in the oxide glass or oxide glass-ceramic is desirably greater than 30 weight % and in some embodiments as high as 70 weight %. Non-silica-based glasses and glass-ceramics may be used in the practice of one or more embodiments of the invention, but are generally less preferred because of their higher cost and/or inferior performance characteristics. The critical feature of the glass, regardless of whether it is silica or non-silica based, is that it exhibit a linear coefficient thermal of expansion (25-300° C.) which is within the range of $+/-20 \times 10^{-7}$/° C. of the linear coefficient thermal of expansion of the germanium which is generally about is $61 \times 10^{-7}$/° C. In certain embodiments the linear coefficient thermal of expansion (25-300° C.) of the glass substrate should be within the range of 50-70× $10^{-7}$/° C. and in still further embodiments the linear coefficient thermal of expansion (25-300° C.) of the glass substrate should match that of germanium and be about $61 \times 10^{7}$/° C.

For certain applications, e.g., display and photovoltaic applications, the glass or glass-ceramic 104 is preferably transparent in the visible, near UV, and/or IR wavelength ranges, e.g., the glass or glass ceramic 104 is preferably transparent in the 350 nm to 2 micron wavelength range.

Although the glass or glass-ceramic substrate 104 is preferably composed of a single glass or glass-ceramic, laminated structures can be used if desired. When laminated structures are used, the layer of the laminate closest to the Ge semiconductor layer 102 preferably has the properties discussed herein for a glass substrate 104 composed of a single glass or glass-ceramic. Layers farther from the Ge semiconductor layer 102 preferably also have those properties, but may have relaxed properties because they do not directly interact with the Ge semiconductor layer 102. In the latter case, the glass or glass-ceramic substrate 104 is considered to have ended when the properties specified for a glass substrate 104 are no longer satisfied.

Desirable glasses for use in the present invention include alkali, alkaline earth, or rare earth aluminosilicate or boroaluminosilicate glasses having the aforementioned CTE characteristic of a linear coefficient thermal of expansion (25-300° C.) which is within the range of $+/-20 \times 10^{-7}$/° C. of the linear coefficient thermal of expansion of the germanium. Additionally, it is desirable that, due to germanium's relatively low melting point of ~973° C. and thus the recommended bonding temperatures which should generally be below the melting point of germanium. As such glass, glass-based substrates which exhibit a strain point temperatures of at least 500° C. and up to 900° C. can be utilized. It should be noted that bonding temperatures below the strain point of the glass based substrates are typically utilized and it is within the knowledge of those skilled in art to utilize the appropriate bonding temperature which results in the necessary and sufficient bonding between the glass based structure and the germanium material.

In a first embodiment the glass for use in the instant germanium-on-glass structures comprises a glass having a composition, calculated in weight percent and calculated from the batch on an oxide basis, of: 15-45% $SiO_2$, 7.5-20% $Al_2O_3$, 15-45% MgO+CaO+SrO+BaO and up to 55% $RE_2O_3$, RE being selected from the rare earth element group consisting Sc, Y, La, Ce, Pr, Nd, Sm, Eu, Gd, Tb, Dy, Ho, Er, Tm, Yb, Lu and mixtures thereof.

In a still further embodiment the glass for use in the instant germanium-on-glass structures comprises a glass having a composition comprising, calculated in weight percent and calculated from the batch on an oxide basis, of: 55-65% $SiO_2$, 8-20% $Al_2O_3$, 0-8% $B_2O_3$, and 12-30% MgO+CaO+SrO+ BaO+ZnO+$TiO_2$-$ZrO_2$. It is preferred that the composition above not include any alkali components ($Na_2O$ $K_2O$, $Li_2O$), however up to 10% alkali is however acceptable.

In yet another embodiment the glass for use in the instant germanium-on-glass structures comprises a glass having a composition comprising, calculated in weight percent and calculated from the batch on an oxide basis, of: 45-70% $SiO_2$, 2.5-30% $Al_2O_3$, 0-8% $B_2O_3$, 2.5-30% MgO+CaO+SrO+BaO and 1-20% $La_2O_3$+$Y_2O_3$.

Examples of representative CTE matching glass compositions suitable for use in the instant invention are given in weight % in Table I below; The skilled artisan can make these and other suitable glass compositions using standard methods. For example, the glasses listed below can be made by mixing the component oxide, halide (e.g., $AlCl_3$), nitrate, and/or carbonate ($CaCO_3$) powders in a ball mill for 1 hour to make a 1 kg batch. The mixed batch can then be loaded into a Pt crucible and melted in a 1550°-1650° C. globar furnace overnight, after which time the melted glass can be poured onto a steel plate and annealed between 700° C. and 800° C. to alleviate stress.

The properties of these glasses can be tailored by the skilled artisan by modifying the composition. For example, the strain point can be increased by increasing the $SiO_2$ content and the ratio of $Al_2O_3$ to $RE_2O_3$ (RE=rare earth and includes Sc, Y, La, Ce, Pr, Nd, Sm, Eu, Gd, Th, Dy, Ho, Er, Tm, Yb, Lu), as well as by changing the identity of $RE_2O_3$. For example, replacing $La_2O_3$ with $Y_2O_3$ will increase the strain point and decrease the CTE. The skilled artisan can add small amounts (e.g., up to a few percent) alkali or alkaline-earth ions to the alkali and alkaline-earth ion-free compositions listed below in order to obtain glasses more suitable for use in the bonding methods described herein below. However, sodium ions are well-known to be detrimental to silicon transistors, and presumably should be avoided for germanium as well. Larger alkali ions with lower diffusion rates may be acceptable, particularly as the peak processing temperature is 650° C. or less. Therefore, the glass compositions are most preferably sodium-free. Low-iron compositions are also preferred.

| -continued | |
|---|---|
| $TiO_2$ | 0-10 |
| $ZrO_2$ | 0-10 |

Representative glass-ceramics for use in the instant germanium-on-glass structures include those disclosed below in Table III. The glass-ceramics disclosed therein formed using standard glass-ceramic formation methods known to those skilled in the art. For example, the glass-ceramics disclosed below could be cerammed at temperatures ranging between 800-1000° C. for periods ranging between 1-10 hours; the two examples below were cerammed at 800° C. for 1 hour, followed by a 900° C. treatment for 2 hours.

TABLE I

| | 1 | 2 | 3 | 4 | 5 | 6 | 7 | 8 | 9 | 10 |
|---|---|---|---|---|---|---|---|---|---|---|
| $SiO_2$ | 43.3 | 32.9 | 32.3 | 30.5 | 62.1 | 60.3 | 55.5 | 61.1 | 57 | 62 |
| $Al_2O_3$ | 13.6 | 9.3 | 13.7 | 19.0 | 14.6 | 14.3 | 15.2 | 14.5 | 17 | 10 |
| $B_2O_3$ | | | | | | | | | 3 | 3 |
| MgO | | | | | | 1.4 | | 1.7 | | 2 |
| CaO | | | | | 23.3 | 18.8 | 6.8 | 18.1 | 14 | 15 |
| SrO | 17.0 | | | | | | 4.4 | | | |
| BaO | 25.5 | 28.0 | 17.2 | | | 5.2 | 22.5 | | 2 | |
| $Na_2O$ | 0.2 | | | | | | | | 1 | 2 |
| $K_2O$ | | | | | | | | | 5 | 4 |
| $La_2O_3$ | | 29.0 | 35.9 | 49.7 | | | | | | |
| $Yb_2O_3$ | | 0.8 | 0.9 | 0.8 | | | | | | |
| $TiO_2$ | | | | | | | | | 2 | |
| C.T.E. $\times 10^{-7}$/° C. | 67 | 73 | 64 | 55 | 55 | 53 | 52 | 54 | 54 | 67 |
| Strain point ° C. | 695 | 775 | 801 | 804 | 728 | 707 | 714 | 735 | 723 | 680 |

TABLE II

| | 882egn | 882EQT | 882ELA | 882EQU | 882EIQ | 882EQV | 882ERN | 882ERJ | 882ERB | 882ERC |
|---|---|---|---|---|---|---|---|---|---|---|
| $Al_2O_3$ | 18.08 | 18.97 | 16.43 | 18.47 | 17.63 | 18.58 | 20.17 | 17.93 | 4.58 | 4.51 |
| $B_2O_3$ | | 1.10 | | 0.54 | | 1.16 | | | 3.46 | 3.41 |
| BaO | | 0.01 | | 0.01 | 4.42 | 0.02 | | | 23.58 | 20.64 |
| CaO | | 1.77 | 5.16 | 1.96 | | 1.06 | 22.95 | 28.08 | | |
| $La_2O_3$ | 38.50 | 31.20 | 29.99 | 32.52 | 37.55 | 33.67 | 20.62 | | | |
| MgO | 1.99 | 2.66 | 0.01 | 3.03 | | 3.82 | 0.46 | 0.57 | | |
| $SiO_2$ | 41.43 | 43.05 | 48.41 | 42.47 | 40.40 | 40.22 | 35.78 | 37.53 | 42.14 | 42.22 |
| SrO | | 1.23 | | 0.99 | | 1.47 | 0.01 | 0.01 | 15.87 | 13.88 |
| $Y_2O_3$ | | | | | | | | 15.88 | 10.38 | 15.34 |
| C.T.E. $\times 10^{-7}$/° C. | 45.3 | 45.5 | 45.9 | 46.4 | 47 | 49 | 68.1 | 72.1 | 77.2 | 72.1 |
| Strain point ° C. | 776 | 751 | 779 | 754 | 802 | 744 | 752 | 762 | 670 | 694 |

Desirable glass-ceramics for use in the present should exhibit the same aforementioned CTE characteristic of a linear coefficient thermal of expansion (25-300° C.) which is within the range of $+/-20 \times 10^{-7}$/° C. of the linear coefficient thermal of expansion of the germanium. In particular, the spinel glass-ceramics within the following compositional range can be formulated to exhibit the necessary $+/-20 \times 10^{-7}$/° C. CTE property.

| $SiO_2$ | 30-55 |
|---|---|
| $Al_2O_3$ | 18-28 |
| ZnO | 8-20 |
| MgO | 0-6 |
| CaO | 0-3 |
| SrO | 0-3 |
| BaO | 0-3 |
| $K_2O$ | 0-10 |
| $Rb_2O + Cs_2O$ | 0-15 |

TABLE III

| | 11 | 12 |
|---|---|---|
| $SiO_2$ | 47.0 | 44.8 |
| $Al_2O_3$ | 26.0 | 19.0 |
| MgO | 2.0 | 5.0 |
| ZnO | 9.0 | 10.3 |
| CaO | 2.0 | |
| BaO | | 2.0 |
| $K_2O$ | 8.0 | |
| $Cs_2O$ | | 12.1 |
| $TiO_2$ | 6.0 | 2.6 |
| $ZrO_2$ | | 5.2 |
| Crystalline phase | Spinel | Spinel |
| C.T.E. $\times 10^{-7}$/° C. | 61 | 57 |
| Strain point ° C. | 766 | 883 |

Figure 2:
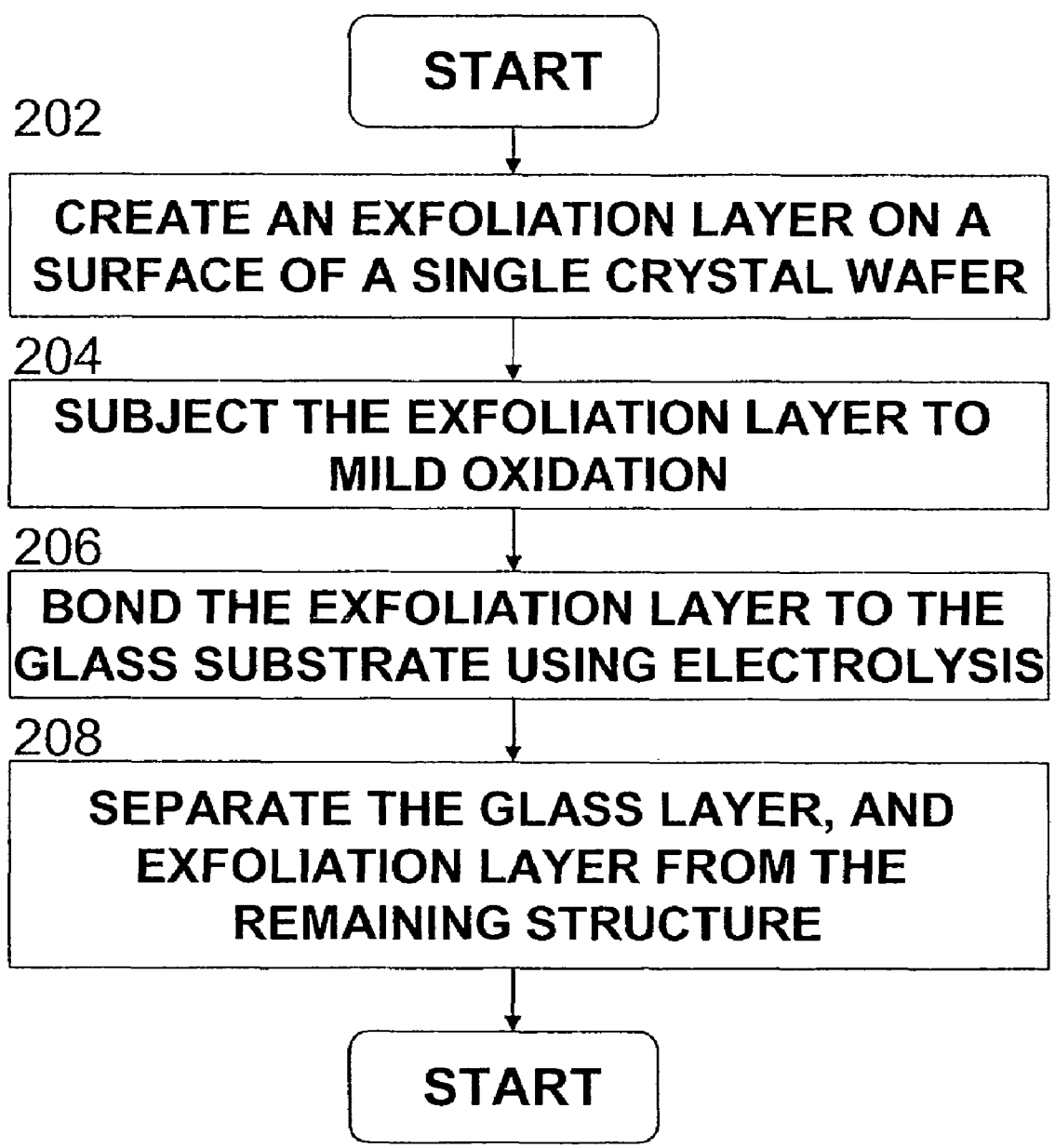
FIG. 2 is a flow diagram illustrating process steps that may be carried out to produce the GeOG structure of FIG. 1.
Figure 3:
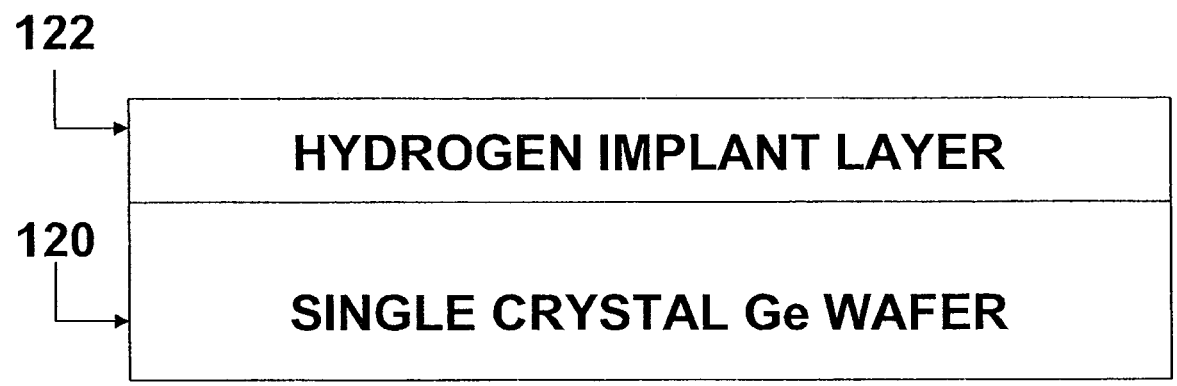
FIG. 3 is block diagrams illustrating a process of forming the GeOG structure of FIG. 1 using the process of FIG. 2.

Reference is now made to FIGS. 2 and 3, which illustrate process steps that may be carried out in order to produce an intermediate structure in connection with fabricating the GeOG structure 100 of FIG. 1. At action 202, an exfoliation layer 122 is formed on a surface of the semiconductor wafer 120 (FIG. 3). For the purposes of discussion, the semiconductor wafer 120 is preferably a substantially single crystal Ge wafer.

The exfoliation layer 122 is preferably a relatively thin layer of germanium that may be separated from the Ge semiconductor wafer 120 (which will be discussed later herein). Although the embodiments of the present invention are not limited to any particular method of forming the exfoliation layer, one suitable method includes the use of ion implantation to create a weakened region below the surface of the germanium wafer 120. By way of example, hydrogen ion implantation may be employed, although other ions or multiples thereof may be employed, such as boron+hydrogen, helium+hydrogen, or other ions known in the literature for exfoliation. Again, any other known or hereinafter developed technique suitable for forming the exfoliation layer 122 may be employed without departing from the spirit and scope of the present invention.

In one embodiment a single step hydrogen implantation alone is used and involves subjecting the Ge wafer to an H ion implant dosage of between $1 \times 10^{16} - 1 \times 10^{17}$ ions/cm$^2$. In another, low dosage embodiment, the Ge wafer is subject to multiple ion, low dosage, implant steps. Particularly, a combination H and He low dosage implantation is utilized and involves first subjecting the Ge wafer to an H ion implant dosage ranging between $1 \times 10^{15}$ to $5 \times 10^{16}$ ions/cm$^2$, followed by a Helium implant dosage, again at low dosage level ranging between $1 \times 10^{15}$ to $5 \times 10^{16}$ ions/cm$^2$.

No matter what technique is employed to create the exfoliation layer 122, the germanium wafer 120 is preferably treated to reduce the (e.g., hydrogen) ion concentration on the surface. For example, at action 204, the semiconductor wafer 120 is preferably washed and cleaned and the exfoliation layer 122 is preferably subject to mild oxidation. The mild oxidation treatments may include treatment in oxygen plasma, ozone treatments, treatment with hydrogen peroxide, hydrogen peroxide and ammonia, hydrogen peroxide and an acid or a combination of these processes. It is expected that during these treatments hydrogen terminated surface groups oxidize to hydroxyl groups, which in turn also makes the surface of the silicon wafer hydrophilic. The treatment is preferably carried out at room temperature for the oxygen plasma and at temperature between 25-150° C. for the ammonia or acid treatments. Following this treatment, the glass wafer is washed in a detergent followed by distilled water and thereafter further washed with nitric acid and then distilled water.

It should be noted that these treatments are optimum. If hydrogen ion concentration is not reduced there is a repulsive force between the silicon and glass wafers which may be overcome during the bonding process via application of higher pressure.

Following ion implantation, the respective structures are preferably bonded together using an electrolysis process. A preferred electrolysis bonding process is described in U.S. Patent Application No. 2004/0229444, the entire disclosure of which is hereby incorporated by reference. Portions of this process are discussed below.

Figure 4:
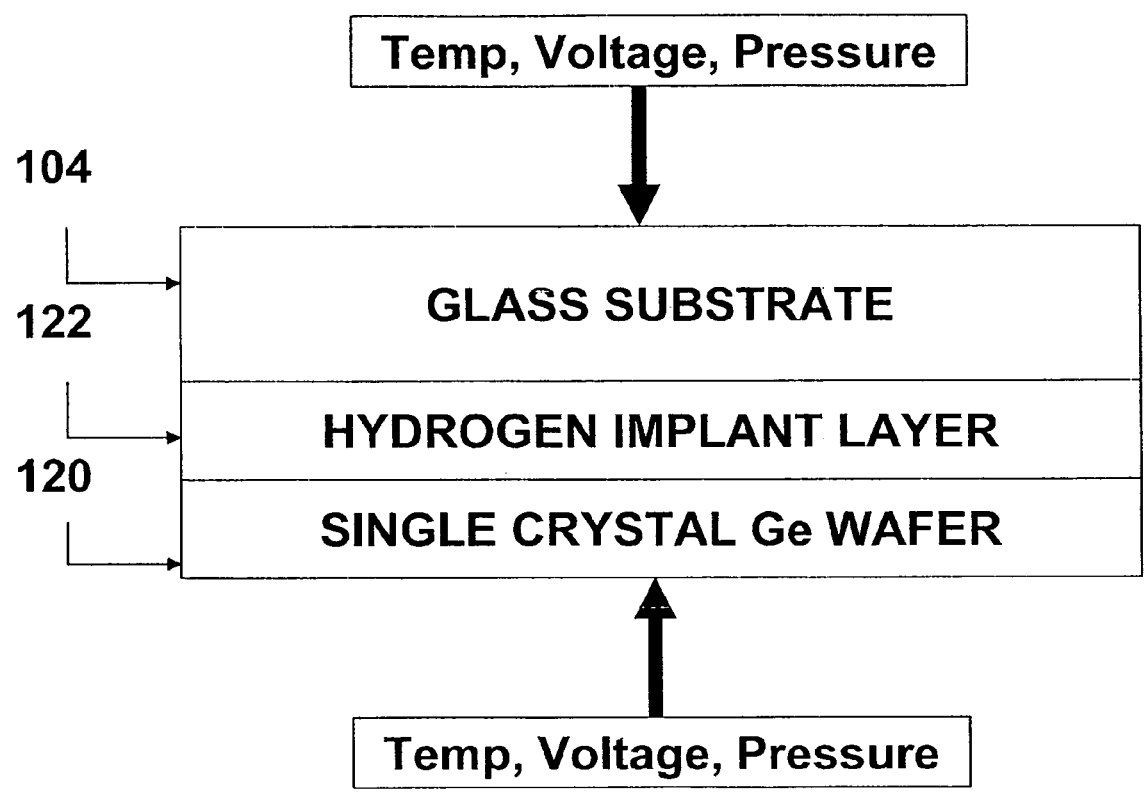
FIG. 4 is a block diagram illustrating a process of bonding a glass substrate to the intermediate structure of FIG. 3.

Initially, appropriate surface cleaning is preferably carried out. Thereafter, the intermediate structures are brought into direct or indirect contact to achieve the arrangement schematically illustrated in FIG. 4. Prior to or after the contact, the structure(s) comprising the Ge semiconductor wafer 120, the exfoliation layer 122 and the glass substrate 104 are heated under a differential temperature gradient. Preferably the glass substrate 104 is heated to a higher temperature than the Ge semiconductor wafer 120 and exfoliation layer 122. By way of example, the temperature difference between the glass substrate 102 and the Ge semiconductor wafer 120 is at least 1° C., although the difference may be as high as about 100 to about 150° C. This temperature differential is desirable for a glass having a coefficient of thermal expansion (CTE) matched to that of germanium since it facilitates later separation of the exfoliation layer 122 from the semiconductor wafer 120 due to thermal stresses.

Once the temperature differential between the glass substrate 104 and the Ge semiconductor wafer 120 is stabilized, mechanical pressure is applied to the intermediate assembly. The preferred pressure range is between about 1 to about 50 psi. Application of higher pressures, e.g., pressures above 100 psi, might cause breakage of the glass wafer.

The glass substrate 104 and the Ge semiconductor wafer 120 are preferably taken to a temperature within about +/−150° C. of the strain point of the glass substrate 104.

Next, a voltage is applied across the intermediate assembly, preferably with the Ge semiconductor wafer 120 at the positive electrode and the glass substrate 104 the negative electrode. The application of the voltage potential causes alkali or alkaline earth ions in the glass substrate 104 to move away from the Ge semiconductor/glass interface further into the glass substrate 104. This accomplishes two functions: (i) an alkali or alkaline earth ion free interface is created; and (ii) the glass substrate 104 becomes very reactive and bonds to the Ge semiconductor layer 102 strongly with the application of heat at relatively low temperatures.

At action 208, FIG. 2, after the intermediate assembly is held under these conditions for some time (e.g., approximately 1 hr or less), the voltage is removed and the intermediate assembly is allowed to cool to room temperature. At some point during the above process, the Ge semiconductor wafer 120 and the glass substrate 102 are separated, which may include some peeling if they have not already become completely free, to obtain a glass substrate 104 with a thin Ge semiconductor layer 104 bonded thereto as illustrated in FIG. 1. The separation of the donor semiconductor wafer from the exfoliation layer that is bonded to the glass substrate 102 is accomplished through application of stress to the zone of weakness within the donor semiconductor wafer, such as by a heating and/or cooling process. It is noted that the characteristics of the heating and/or cooling process may be established as a function of a strain point of the glass substrate 102. Although the invention is not limited by any particular theory of operation, it is believed that glass substrates 102 with relatively low strain points may facilitate separation when the respective temperatures of the donor semiconductor wafer and the glass substrate 102 are falling or have fallen during cooling. Similarly, it is believed that glass substrates 102 with relatively high strain points may facilitate separation when the respective temperatures of the donor semiconductor wafer and the glass substrate 102 are rising or have risen during heating. Separation of the donor semiconductor wafer and the glass substrate 102 may also occur when the respective temperatures thereof are neither substantially rising nor falling (e.g., at some steady state or dwell situation).

The separation is preferably accomplished via fracture of the exfoliation layer 122 due to thermal stresses. Alternatively or in addition, mechanical stresses such as water jet cutting or chemical etching may be used to facilitate the separation.

It should be noted that the atmosphere during the bonding (heating and application of voltage) process may be either an inert atmosphere, such as nitrogen and/or argon or simply an ambient air atmosphere.

As illustrated in FIG. 1, after separation, the resulting structure may include the glass substrate 104, and the Ge semiconductor layer 102 bonded thereto. Any unwanted Ge semiconductor material may be removed via polishing techniques, e.g., via CMP or other techniques known in the art to obtain the single crystal germanium layer 102 on the glass substrate 104.

It is noted that the Ge semiconductor wafer 120 may be reused to continue producing other GeOG structures 100.

Figure 5:
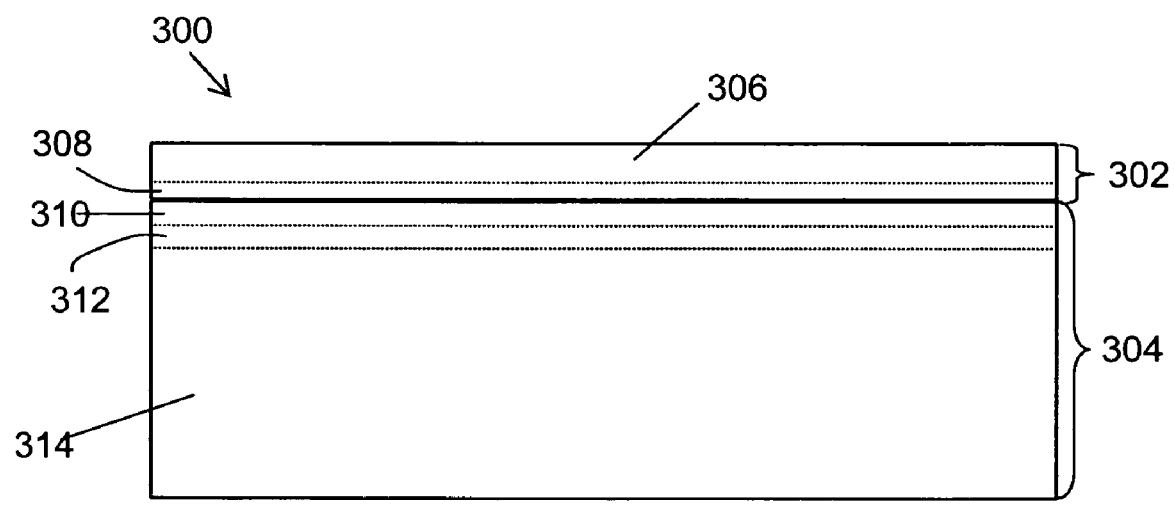
FIG. 5 is a schematic cross-sectional view of a GeOG structure according to another embodiment of the present invention.

It should be noted that another embodiment of the invention is shown in cross-sectional schematic view in FIG. 5. Semiconductor-on-glass structure 300 includes a first layer 302 and a second layer 304, substantially described above. Semiconductor-on-insulator structure 300 includes, in order, the germanium semiconductor material (306); the germanium semiconductor material with an enhanced oxygen content (308); the glass or glass-ceramic having a linear coefficient thermal of expansion (25-300° C.) which is within the range of $+/-20 \times 10^{-7}/°$ C. of the linear coefficient thermal of expansion of the germanium, with a reduced positive ion concentration for at least one type of positive ion (310); the glass or glass-ceramic material with an enhanced positive ion concentration for at least one type of positive ion (312); and the glass or glass ceramic (314).

EXAMPLES

The present invention is further described by the following non-limiting examples.

Example 1

A Germanium wafer (<100>) exhibiting a 100 mm diameter and a thickness of 500 microns thick was subjected to a hydrogen ion implantation process which involved utilizing a dosage of $4 \times 10^{16}$ ions/cm$^2$ and implantation energy of 100 KeV. The wafer was then treated in oxygen plasma, under standard conditions, for a period of 10 minutes so as to oxidize the surface groups. An alkali aluminoborosilicate glass wafer having a composition (in weight percent) as follows was provided:

64.1% SiO$_2$, 8.4% B$_2$O$_3$, 4.2 Al$_2$O$_3$, 6.4 Na$_2$O,
6.9K$_2$O, 5.9 ZnO 4.0 TiO$_2$, 0.1 Sb$_2$O$_3$.

The glass exhibited a 100 mm diameter, a linear thermal CTE matched to that of Germanium, and a strain point of 529° C. The glass wafer was washed with Fischer scientific Contrad 70 detergent in ultrasonic bath for 15 minutes followed by distilled water wash for 15 minutes in ultrasonic bath. The glass wafer was thereafter washed in 10% nitric acid, again followed by distilled water wash. Both these wafers were finally cleaned in a spin washer dryer with distilled water in the clean room. The two wafers were then brought into contact, ensuring that no air was trapped between the wafers, and then the wafers were introduced into SUSS MICROTEC bonder. The glass wafer was placed on the negative electrode and the silicon wafer was placed on the positive electrode. The two wafers were respectively heated to 525° C. (germanium wafer) and 595° C. (glass wafer). A potential of 1750 Volts was applied across the wafer surface. The voltage was applied for 20 minutes at the end of which the voltage was brought to zero and the wafers were cooled to room temperature. The wafers were then easily separated resulting in a GeOG structure and a Ge wafer for later reuse.

Figure 6:
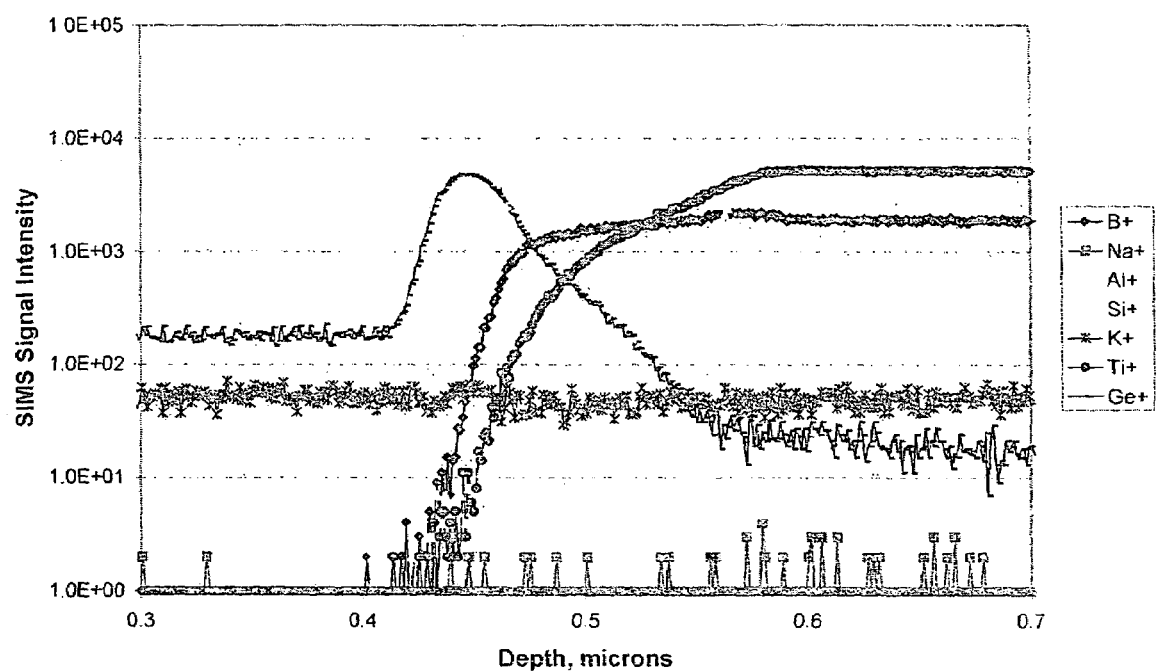
FIG. 6 is TOF-SIMs depth profile of a GeOG structure of the type illustrated in FIG. 4 and made in accordance with the invention described herein.

An excellent quality GeOG sample was produced via this process. In particular the GeOG sample possessed a strongly adhered thin (0.5 μm), defect-free germanium film on glass surface. FIG. 6 shows the TOF-SiMs analysis indicating the barrier layer formation in the process.

Example 2

The above experiment was repeated with an alkaline earth aluminosilicate glass (particularly a calcium aluminosilicate glass exhibiting the Example 8 composition as described above) wafer without any alkali present in the composition. The glass exhibited a strain point of 735° C. and again exhibited a CTE which matched that of the Ge wafer. In this case, again an excellent Ge defect-free thin film (0.5 μm ) transfer to glass was obtained, which was evidence of the fact that the presence of alkali ions in the glass in the compositions is not necessary.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

The invention claimed is:

1. A semiconductor-on-insulator structure comprising first and second layers which are attached to one another either directly or through one or more intermediate layers, wherein the first layer comprises a substantially single crystal semiconductor material comprising germanium; the second layer comprises a glass or a glass-ceramic having a linear coefficient thermal of expansion (25-300° C.) which is about $61 \times 10^{-7}/°$ C. and within the range of $+/-20 \times 10^{-7}/°$ C. of the linear coefficient thermal of expansion of the germanium first layer.

2. The semiconductor-on-insulator structure of claim 1, wherein the glass or glass-ceramic has a strain point of equal to or greater than 650° C.

3. The semiconductor-on-insulator structure of claim 1, wherein the glass or glass-ceramic has a strain point of equal to or greater than 700° C.

4. A semiconductor-on-insulator structure comprising first and second layers which are attached to one another either directly or through one or more intermediate layers, wherein:
    the first layer comprises a substantially single crystal semiconductor material comprising Germanium;
    the second layer comprises a glass having a linear coefficient thermal of expansion (25-300° C.) which is within the range of $+/-20 \times 10^{-7}/°$ C. of the linear coefficient thermal of expansion of the germanium first layer; and
    the glass has a composition comprising, calculated in weight percent and calculated from the batch on an oxide basis, of: 15-45% SiO$_2$, 7.5-15% Al$_2$O$_3$, 15-45% MgO+CaO+SrO+BaO and up to 55% RE$_2$O$_3$, RE being selected from the rare earth element group consisting Sc, Y, La, Ce, Pr, Nd, Sm, Eu, Gd, Th, Dy, Ho, Er, Tm, Yb, Lu and mixtures thereof.

5. A semiconductor-on-insulator structure comprising first and second layers which are attached to one another either directly or through one or more intermediate layers, wherein:
    the first layer comprises a substantially single crystal semiconductor material comprising Germanium;
    the second layer comprises a glass having a linear coefficient thermal of expansion (25-300° C.) which is within the range of +/−20×10$^{-7}$/° C. of the linear coefficient thermal of expansion of the germanium first layer; and the glass has a composition comprising, calculated in weight percent and calculated from the batch on an oxide basis, of 45-70% SiO$_2$, 2.5-30% Al$_2$O$_3$, 0-8% B$_2$O$_3$, 2.5-30% MgO+CaO+SrO+BaO and 1-20% La$_2$O$_3$+Y$_2$O$_3$.

6. A semiconductor-on-insulator structure comprising first and second layers which are attached to one another either directly or through one or more intermediate layers, wherein:

the first layer comprises a substantially single crystal semiconductor material comprising germanium;

the second layer comprises a glass having a linear coefficient thermal of expansion (25-300° C.) which is within the range of +/−20×10$^{-7}$/° C. of the linear coefficient thermal of expansion of the germanium first layer; and the glass has a composition comprising, calculated in weight percent and calculated from the batch on an oxide basis, of: 55-65% SiO$_2$, 10-20% Al$_2$O$_3$, and 15-30% MgO+CaO+SrO+BaO.

7. A semiconductor-on-insulator structure comprising first and second layers which are attached to one another either directly or through one or more intermediate layers, wherein:

the first layer comprises a substantially single crystal semiconductor material comprising germanium;

the second layer comprises a glass-ceramic having a linear coefficient thermal of expansion (25-300° C.) which is within the range of +/−20×10$^{-7}$/° C. of the linear coefficient thermal of expansion of the germanium first layer; and the glass-ceramic has a composition comprising, calculated in weight percent and calculated from the batch on oxide basis, of: 30-55% SiO$_2$, 18-28% Al$_2$O$_3$, 8-20% ZnO, 0-6% ZnO, 0-6% MgO, 0-3% CaO, 0-3% SrO, 0-3% BaO, 0-3% K$_2$O, 0-15% Rb$_2$O+C$_2$O, 0-10% TiO$_2$ and 0-10% ZrO$_2$.

8. The semiconductor-on-insulator structure of claim 1, wherein the glass or glass-ceramic is essentially free of alkali ions.

9. The semiconductor-on-insulator structure of claim 1, wherein the bond strength between the first and second layers is at least 8 J/m$^2$.

10. The semiconductor-on-insulator structure of claim 1, wherein at least part of the structure comprises, in order: the germanium semiconductor material; the germanium semiconductor material with an enhanced oxygen content; the glass or glass ceramic material with a reduced positive ion concentration for at least one type of positive ion; the glass or glass ceramic material with an enhanced positive ion concentration for at least one type of positive ion; and the glass or glass ceramic.

11. The semiconductor-on-insulator structure of claim 1, wherein the first layer has a thickness of no greater than about 1 um.

12. The semiconductor-on-insulator structure of claim 4, wherein the glass has a strain point of equal to or greater than 650° C.

13. The semiconductor-on-insulator structure of claim 4, wherein at least part of the structure comprises, in order: the germanium semiconductor material; the germanium semiconductor material with an enhanced oxygen content; the glass with a reduced positive ion concentration for at least one type of positive ion; the glass with an enhanced positive ion concentration for at least one type of positive ion; and the glass.

14. The semiconductor-on-insulator structure of claim 5, wherein the glass has a strain point of equal to or greater than 650° C.

15. The semiconductor-on-insulator structure of claim 5, wherein at least part of the structure comprises, in order: the germanium semiconductor material; the germanium semiconductor material with an enhanced oxygen content; the glass with a reduced positive ion concentration for at least one type of positive ion; the glass with an enhanced positive ion concentration for at least one type of positive ion; and the glass.

16. The semiconductor-on-insulator structure of claim 6, wherein the glass has a strain point of equal to or greater than 650° C.

17. The semiconductor-on-insulator structure of claim 6, wherein at least part of the structure comprises, in order: the germanium semiconductor material; the germanium semiconductor material with an enhanced oxygen content; the glass with a reduced positive ion concentration for at least one type of positive ion; the glass with an enhanced positive ion concentration for at least one type of positive ion; and the glass.

18. The semiconductor-on-insulator structure of claim 7, wherein the glass-ceramic has a strain point of equal to or greater than 650° C.

19. The semiconductor-on-insulator structure of claim 7, wherein at least part of the structure comprises, in order: the germanium semiconductor material; the germanium semiconductor material with an enhanced oxygen content; the glass-ceramic with a reduced positive ion concentration for at least one type of positive ion; the glass-ceramic material with an enhanced positive ion concentration for at least one type of positive ion; and the glass-ceramic.

20. The semiconductor-on-insulator structure of claim 7, wherein the glass-ceramic is spinel in the predominant crystal phase.

* * * * *